United States Patent
Ihara et al.

(10) Patent No.: US 8,895,227 B2
(45) Date of Patent: Nov. 25, 2014

(54) DEVELOPING SOLUTION FOR PHOTORESIST ON SUBSTRATE INCLUDING CONDUCTIVE POLYMER, AND METHOD FOR FORMING PATTERN

(75) Inventors: Takashi Ihara, Nagoya (JP); Hiromu Taguchi, Nagoya (JP)

(73) Assignee: Toagosei Co., Ltd., Tokyo (JP)

( * ) Notice: Subject to any disclaimer, the term of this patent is extended or adjusted under 35 U.S.C. 154(b) by 54 days.

(21) Appl. No.: 13/519,598

(22) PCT Filed: Jan. 20, 2011

(86) PCT No.: PCT/JP2011/050975
§ 371 (c)(1),
(2), (4) Date: Aug. 10, 2012

(87) PCT Pub. No.: WO2011/090114
PCT Pub. Date: Jul. 28, 2011

(65) Prior Publication Data
US 2013/0017375 A1  Jan. 17, 2013

(30) Foreign Application Priority Data
Jan. 25, 2010 (JP) .................... 2010-012873

(51) Int. Cl.
*G03F 7/30* (2006.01)
*G03F 7/32* (2006.01)

(52) U.S. Cl.
CPC . *G03F 7/322* (2013.01); *G03F 7/30* (2013.01)
USPC ............ 430/306; 430/309; 430/313; 430/329

(58) Field of Classification Search
CPC ............ G03F 7/322; G03F 7/30; G03F 7/32; B41N 3/03
USPC ................................ 430/306, 309; 428/195.1
See application file for complete search history.

(56) References Cited

U.S. PATENT DOCUMENTS 4,863,835 A * 9/1989 Shimizu et al. ............... 430/331
2001/0006767 A1 * 7/2001 Kawamonzen et al. ...... 430/330
(Continued)

FOREIGN PATENT DOCUMENTS

CN 1938647 A 3/2007
JP 61-118744 6/1986
(Continued)

OTHER PUBLICATIONS

International Search Report issued on Feb. 15, 2011 in PCT/JP11/50975 filed on Jan. 20, 2011.

(Continued)

*Primary Examiner* — Chanceity Robinson
(74) *Attorney, Agent, or Firm* — Oblon, Spivak, McClelland, Maier & Neustadt, L.L.P.

(57) ABSTRACT

A developing solution is disclosed with which it is possible to develop a photoresist disposed on a substrate including a conductive polymer. Also disclosed is a method for forming a resist pattern using the developing solution. The developing solution contains one or more acids and/or salts thereof, the acids being selected from inorganic acids, amino acids having an isoelectric point less than 7, and carboxylic acids having two or more carboxy groups. Use of this developing solution hence inhibits the phenomenon in which a substrate including a conductive polymer suffers an increase in surface resistivity due to a developing solution, and makes it possible to obtain a fine resist pattern.

12 Claims, 1 Drawing Sheet

(56) References Cited

U.S. PATENT DOCUMENTS

| | | | |
|---|---|---|---|
| 2003/0031960 A1* | 2/2003 | Fiebag et al. | 430/331 |
| 2005/0098775 A1 | 5/2005 | Kondo | |
| 2010/0183853 A1* | 7/2010 | Ihara | 428/195.1 |
| 2011/0091814 A1* | 4/2011 | Endo | 430/302 |

FOREIGN PATENT DOCUMENTS

| | | | |
|---|---|---|---|
| JP | 2001-281841 A | | 10/2001 |
| JP | 2003-287879 A | | 10/2003 |
| JP | 2004 004145 | | 1/2004 |
| JP | 2005-109435 | | 4/2005 |
| JP | 2006-58497 | | 3/2006 |
| JP | 2006 058497 | | 3/2006 |
| JP | 2006058497 A | * | 3/2006 |
| JP | 2006-220961 A | | 8/2006 |
| TW | 200905421 A | | 2/2009 |
| WO | WO 97/18944 | | 5/1997 |
| WO | WO 2005/085957 A1 | | 9/2005 |
| WO | WO 2008/152907 A1 | | 12/2008 |
| WO | 2009 096438 | | 8/2009 |

OTHER PUBLICATIONS

Office Action issued Aug. 26, 2013 in Chinese Patent Application No. 201180005211.9 with English language translation.

Office Action issued in corresponding Chinese patent application No. 201180005211.9 dated Apr. 17, 2014 (with partial English translation).

* cited by examiner

DEVELOPING SOLUTION FOR PHOTORESIST ON SUBSTRATE INCLUDING CONDUCTIVE POLYMER, AND METHOD FOR FORMING PATTERN

CROSS-REFERENCE TO RELATED APPLICATIONS

This application is a National Stage of PCT/JP2011/050975 filed on Jan. 20, 2011. This application is based upon and claims the benefit of priority to Japanese Application No. 2010-012873 filed on Jan. 25, 2010.

BACKGROUND OF THE INVENTION

1. Field of the Invention

The present invention relates to a developing solution which can develop a photosensitive resin composition (referred to as a "photoresist") on a substrate containing a conductive polymer, with high sensitivity at high resolution, and to a pattern forming method employing the developing solution. The present invention has characteristic features causing no damages to the conductive polymer in contact with the developing solution, and thus can provide a conductive member having low surface resistance and high conductivity in all application fields with which conductive polymers and photoresists are associated.

2. Background Art

Recent years, a material containing indium oxide and tin oxide components (commonly abbreviated as "ITO") is used as a transparent conductive film material, however, various inorganic and organic materials have been actively studied as alternatives to ITO since indium is a rare element. A conductive polymer, which is an organic material, has a remarkably improved conductivity, and thus is promising as an alternative to ITO.

Conductive polymers have conductivity, translucency and light emitting property, and have characteristic feature of their flexibility higher than that of ITO also after film formation, and have been studied on applications, for example, to transparent conductive films, electrolytic capacitors, antistatic films, batteries and organic EL displays. Some of the conductive polymers have already been put to practical use.

For example, an electronic paper, which is a display element, is required to have flexibility, and a conductive polymer has been studied as a transparent conductive film material.

For an electrolytic capacitor, an attempt has been made to use a conductive solid such as a charge transfer complex and polythiophene in place of conventional electrolytic solution. A conductive polymer having more excellent conductivity can be used to fabricate an electrolytic capacitor having good frequency characteristic. Conductive polymers intended for electrolytic capacitors are also required to be stable chemically and physically and to have excellent heat resistance.

When a conductive polymer is used to form a thin film on the surface of a polymer film or the like, static electricity can be prevented while keeping transparency. Therefore, a coated film is used as a convenient antistatic film, an antistatic container and the like.

The conductive polymer is used as a positive electrode of a secondary battery, for example, in lithium polyaniline batteries and lithium ion polymer batteries.

On the other hand, a conductive polymer can be used, in place of platinum, as a counter electrode of titanium dioxide in dye sensitized solar batteries which are expected as solar batteries cheaper than currently mainstream silicon-based solar batteries. In addition, applications of a conductive polymer to an electronic element such as a diode and a transistor have also been discussed.

Further, there is an organic EL display employing a conductive polymer in its light emitting layer. A flexible display can be produced using an organic material, not glass, as a substrate. The conductive polymer can also be used in a hole transport layer of an organic EL display. The organic EL display is a self-emitting display, and can realize a light-weight thin display having a wide view angle and a high response speed, and thus is now being actively developed as a potential flat panel display.

In this manner, the conductive polymer is an important material for future electronics industry. When the conductive polymer is used, indispensably requires the technique of ensuring the formation of a fine pattern as is the case with ITO.

Fields that require conductive polymer pattern forming involve, for example, electrodes themselves of touch panels, electronic papers, organic EL displays (including low-molecular organic EL displays and high-molecular organic EL displays), inorganic EL displays and self-emitting displays abbreviated as "FED (SED)," and leader lines of the electrodes.

Several methods for the pattern formation of a conductive polymer are known. Patent Document 1 discloses a screen printing method and a printing method utilizing an inkjet or the like. The printing method has the problems of poor pattern accuracy and surface smoothness, although the production steps are simple since film formation is carried out simultaneously with pattern formation. Further, while the formation of a conductive polymer into an ink is necessary for the application of the printing method, there is also the problem of the difficulty in forming the conductive polymer into an ink because the conductive polymer is easy to aggregate.

The photolithographic method is a method for the pattern formation of a conductive polymer by forming a uniform conductive polymer film on the surface of a base material, and then forming a patterned resist film portion (referred to as "resist pattern") or etching a desired portion of the conductive polymer using a resist pattern as a mask. The photolithographic method involves more steps than the printing method, but provides high pattern accuracy, and thus is a common technique widely used in electron/semiconductor fields. In the photolithographic method, a developing solution and a conductive polymer are brought into contact with each other during the course of the pattern formation of the conductive polymer.

A method for forming the pattern of a conductive polymer by the photolithographic method is disclosed in Patent Document 2. Patent Document 2 discloses a method of forming a pattern of a conductive polymer (referred to as "conductive pattern") in which a resist pattern is directly formed on a conductive polymer and the conductive polymer is subjected to etching. The document indicates an electron beam resist and a photoresist as usable resists, but does not explain in detail a developing solution necessary to form a resist pattern. As the developing solution, there is only an example employing "MF-312" (manufactured by Shipley Japan) in the Examples. Patent Document 3 indicates that this product "MF-312" is a metal-free developing solution which contains an aqueous solution of tetramethylammonoium hydroxide (hereinafter, referred to as "TMAH"). Although the technique of fabricating a conductive pattern using a conductive polymer by the conductive polymer photolithographic method was known, as described above, conventionally and commonly used developing solutions, such as TMAH, alone were known as developing solutions for use in the development of a resist.

Patent Document 4 discloses a problem that, when an amine-based removing agent is used to remove a resist film on a conductive polymer, the basic amines, ammonia and piperazine contained in the removing agent increase the surface resistance of the conductive polymer, or penetrate into the conductive polymer to reduce the adhesion between a substrate and the conductive polymer. No case of discussions on influences of a developing solution has been found before, in methods for the pattern formation of a conductive polymer using the conventional lithographic method. However, TMAH, conventionally known as a developing solution, is not an amine, but a nitrogen-containing basic substance, and the possibility is conceivable that TMAH, upon contact with a conductive polymer, may worsen the surface resistance of the conductive polymer and the adhesiveness between the conductive polymer and a substrate, as is the case with an amine-based removing agent.

Regarding adverse effects caused by basic amines or the like contained in the removing agent, Patent Document 4 describes, as a solution, the use of a non-amine-based organic solvent as the removing agent. The removing agent is originally intended to non-selectively and rapidly remove a resist resin entirely, and thus was not a technique which can be applied as a developing solution in the developing process of selectively removing a resist by the photolithographic method.

Namely, there was no case of discussions on adverse effects of conventionally known developing solutions on conductive polymers in techniques of forming the patterns of the conductive polymers, nor was a solution therefor unknown.

PRIOR TECHNICAL DOCUMENT

Patent Document

[Patent Document 1] JP-A 2005-109435
[Patent Document 2] WO 1997/18944
[Patent Document 3] JP-A S61-118744
[Patent Document 4] WO 2008/152907

SUMMARY OF THE INVENTION

Problems that the Invention is to Solve

A developing solution containing TMAH was commonly used for exposing a photoresist film which is coated on a substrate containing a conductive polymer by photolithographic method, and, thereafter, removing the exposed part or non-exposed part, however, TMAH might probably cause damages, including the reduction in conductivity and adhesiveness, to the conductive polymer in contact therewith. An object of the present invention is to provide a developing solution causing no damage to a conductive polymer even when brought into contact with the conductive polymer, thereby providing a pattern of the conductive polymer having high conductivity.

Means for Solving the Problems

The present inventors studied the composition of a developing solution which, upon contact with a substrate containing a conductive polymer, would not cause damages, including the increase in surface resistance and the reduction in adhesiveness to a resist, to the conductive polymer, and also which can selectively develop a photoresist well.

1. A developing solution for a photoresist arranged on a substrate including a conductive polymer, comprising at least one acid selected from the group consisting of an inorganic acid, an amino acid having an isoelectric point of smaller than 7, a carboxylic acid having two or more carboxyl groups, and/or salts thereof, an inorganic alkaline agent and a solvent.

2. The developing solution for a photoresist arranged on a substrate including a conductive polymer according to 1 above, wherein the content of the at least one acid selected from the group consisting of the inorganic acid, the amino acid having an isoelectric point of smaller than 7, the carboxylic acid having two or more carboxyl groups, and/or the salts is in a range from 0.01% to 10% by mass based on the developing solution.

3. The developing solution for a photoresist arranged on a substrate including a conductive polymer according to 1 or 2 above, wherein the alkaline agent comprises a hydroxide and/or a carbonate of potassium and/or sodium.

4. The developing solution for a photoresist arranged on a substrate including a conductive polymer according to any one of 1 to 3 above, wherein the developing solution has a pH from 12 to 13.5.

5. A method for forming a resist pattern by developing a photoresist that is arranged on a substrate including a conductive polymer, comprising an exposing process for leaving at least a part of the surface of the photoresist arranged on the substrate including the conductive polymer unexposed, and a developing process in which the developing solution according to any one of 1 to 4 above is used to develop the photoresist. 6. The method for forming a resist pattern according to 5 above, sequentially comprising:

a film forming process in which a photoresist film is formed on the substrate including the conductive polymer;

a prebaking process in which the photoresist film is heated;

an exposing process in which a resist film through the prebaking process is exposed to leave at least a portion of the surface of the resist film arranged on the surface of the conductive layer in the surface of the resist film unexposed; and a developing process in which either of the exposed part and the unexposed part through the exposing process is removed by means of the developing solution to make at least a portion of the substrate including the conductive polymer expose.

7. The method for forming a resist pattern according to 5 or 6 above, wherein the conductive polymer is a polythiophen or a polypyrrole.

8. The method for forming a resist pattern according to any one of 5 to 7 above, wherein a positive type photoresist is developed by means of a developing solution including at least one acid selected from the group consisting of phosphoric acid, glycine and aspartic acid, an alkaline agent consisting of KOH and $K_2CO_3$, and water.

9. A method for forming a conductive pattern in which at least a part of a substrate including a conductive polymer is removed using the resist pattern which is formed by the method according to any one of 5 to 8 above.

10. A substrate having a conductive pattern which is formed by the method according to 9 above.

Effect of the Invention

The present invention can provide, for example, a conductive polymer substrate which, when the photolithographic method is applied to a substrate containing a conductive polymer, does not harm the conductivity of the conducive polymer, has a resist pattern on its surface and maintains high conductivity, and a conductive pattern of the conductive polymer having a fine pattern and high conductivity.

EMBODIMENTS FOR CARRYING OUT THE INVENTION

Hereinafter, the present invention is described in detail. The unit "%" refers to "% by mass" unless otherwise indicated.

Figure 1:
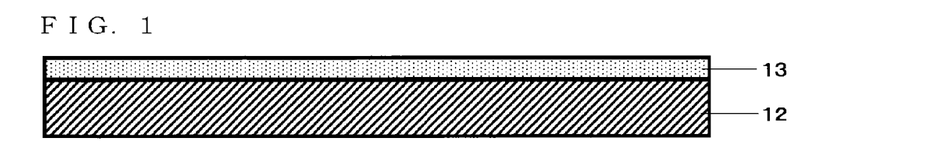
FIG. 1 is a schematic cross-sectional view showing a substrate containing a conductive polymer as a base material, in the state where a resist film is laminated on the surface thereof.
Figure 4:
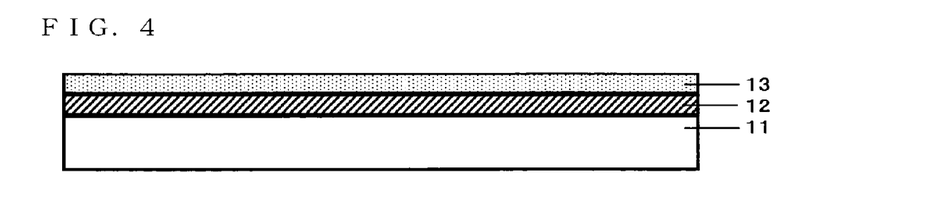
FIG. 4 is a schematic cross-sectional view showing the state where a substrate layer containing a conductive polymer and a resist film are laminated on a base material containing no conductive polymer.
Figure 5:
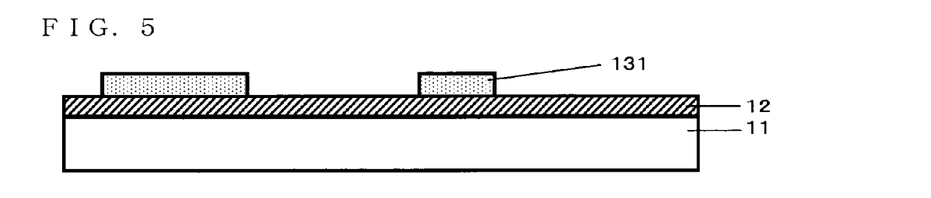
FIG. 5 is a schematic cross-sectional view showing a patterned resist film portion after partial exposure and development of a resist film.

A substrate containing a conductive polymer can be used in various forms, as in the case where a base material itself consists of a substrate containing a conductive polymer as shown in FIG. 1 and the case where a substrate containing a conductive polymer is laminated on a base material containing no conductive polymer to form a substrate layer containing a conductive polymer as shown in FIG. 4. The present invention relates to a resist developing solution used, in either form, when developing a photoresist arranged on a substrate containing a conductive polymer to form a patterned resist film portion having a predetermined form (a portion shown under reference numeral 131 in the drawings) (hereinafter referred to as "developing solution").

Figure 2:
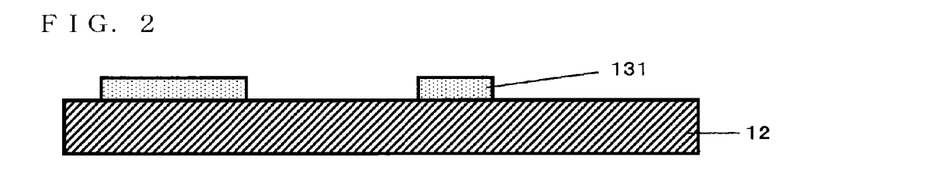
FIG. 2 is a schematic cross-sectional view showing a substrate containing a conductive polymer as a base material, in the state where the resist film laminated on the surface thereof has a patterned resist film portion after partial exposure and development.

The patterned resist film portion 131 (resist pattern) having a predetermined shape formed by development has a structure having a resist pattern on a substrate containing a conductive polymer as shown in FIG. 2. Such an example includes the case where an insulating layer or negative electrode partition wall, which is brought into contact with a conductive polymer layer, is formed of a resist in organic EL.

Figure 3:
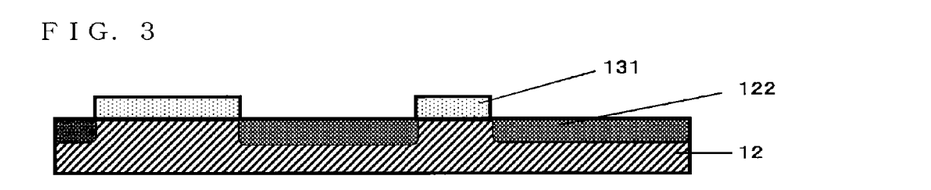
FIG. 3 is a schematic cross-sectional view showing a substrate containing a conductive polymer as a base material, in the state where a part of the substrate containing the conductive polymer, unmasked by the patterned resist film, was brought into contact with another substance, and thus has been altered.

Further, a conductive polymer layer can be impregnated with, or subjected to the action of, a dopant or the like which changes the conductivity, surface resistance and the like, using the resist pattern as a mask, thereby forming a substrate portion 122 containing an altered conductive polymer as shown in FIG. 3.

Figure 6:
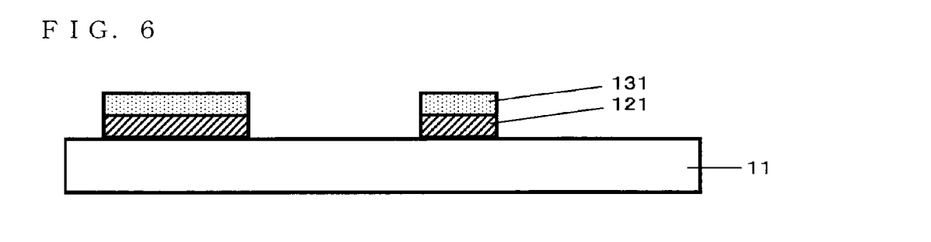
FIG. 6 is a schematic cross-sectional view showing a patterned substrate portion containing a conductive polymer (conductive pattern) after removal of a portion of the substrate layer containing the conductive polymer using the patterned resist film portion as a mask.

In addition, when a substrate layer containing a conductive polymer is partially removed by a method such as etching, a patterned substrate portion containing a conductive polymer can be formed as shown under reference numeral 121 in FIG. 6. The "substrate portion containing a conductive polymer, which has been patterned into a predetermined shape" is referred to as a "conductive pattern." It is also possible to apply a color resist onto the resultant conductive pattern again and to repeat exposure development, thereby obtaining a liquid crystal pixel of RGB three primary colors.

In this manner, the developing solution and pattern forming method of the present invention can be used to apply the photolithographic method to the substrate containing a conductive polymer, thereby producing various electronic parts. The developing solution of the present invention can develop a resist film formed on the surface of a substrate containing a conductive polymer. The resist film is preferably formed at a predetermined thickness on the surface of the substrate containing the conductive polymer by various coating methods. The prebaking process of heating this film, the exposing process in which at least a part of the surface of the resist film obtained by the prebaking process is left unexposed, the removing process in which the exposed part or unexposed part obtained by the exposing process using the developing solution is removed to expose at least a part of the surface of the substrate containing the conductive polymer, and the like can also be applied. Further, the process of introducing other ingredients into the exposed substrate by a method such as doping or changing the properties and the process of removing the exposed substrate portion to form a conductive pattern can be applied. Thereafter, the remaining resist pattern can also be removed.

The resist film that is developed using the developing solution of the present invention consists of at least a photoresist which can be developed by an alkaline developing solution. The photoresist includes a positive type photoresist in which an exposed portion is removed by development and a negative type photoresist in which a non-exposed portion is removed by development but an exposed portion is not removed. The developing solution of the present invention can be applied to both the types, and a positive type which can form a finer pattern is preferred. Preferable negative type resist is a liquid resist and a solid film-shaped resist which is referred to as a dry film. More preferable is a dry film of a solid film-shaped resist. On the other hand, preferable positive type photoresist is a composition containing a naphthoquinone diazide compound and a novolac resin, may further contain a polyvinyl methyl ether, and can contain an additive such as a dye, an adhesion auxiliary and a surfactant to be used generally in combination with the positive type photoresist.

The naphthoquinone diazide compound is a photosensitive component in the positive type photoresist, and example thereof includes 1,2-naphthoquinonediazide-5-sulfonic acid, an ester or amide of 1,2-naphthoquinonediazide-5-sulfonic acid or 1,2-naphthoquinonediazide-4-sulfonic acid.

Among these compounds, preferred is 1,2-naphthoquinonediazide-5-sulfonic acid ester or 1,2-naphthoquinonediazide-4-sulfonic acid ester of a polyhydroxy aromatic compound, and more preferred is 1,2-naphthoquinonediazide-5-sulfonic acid ester or 1,2-naphthoquinonediazide-4-sulfonic acid ester of a polyhydroxy compound such as 2,3,4-trihydroxybenzophenone, 2,3,4,4'-tetrahydroxybenzophenone, 2,2',4,4'-tetrahydroxybenzophenone, and 2,3,4,2',4'-pentahydroxybenzophenone.

The novolac resin is a film forming component of the positive type photoresist. This novolac resin is not especially limited, and those conventionally used as a film forming material in conventionally known positive type photoresist compositions, for example, those obtained by condensing, in the presence of an acid catalyst such as oxalic acid or p-toluene sulfonic acid, an aromatic hydroxy compound such as phenol, cresol and xylenol and an aldehyde such as formaldehyde can be used.

As regards the content ratio between the novolac resin and the naphthoquinone diazide compound in the photoresist, the content of the naphthoquinone diazide compound is in the range from 5 to 100 parts by mass, preferably from 10 to 80 parts by mass, with respect to 100 parts by mass of the novolac resin.

All polymers can be used as the polyvinyl methyl ether, without any limitation depending on the molecular weight or the like, including "Rutonal M40" and "Rutonal A25" manufactured by BASF Corporation. When the positive type photoresist composition contains an additive, the proportion of the total content of the two components, i.e., the novolax resin and naphthoquinone diazide compound, or of the main three components, i.e., these two components plus polyvinyl methyl ether, is preferably 70% or more and more preferably 80% or more, with respect to the entire composition.

Examples of the substrate containing a conductive polymer in the present invention include a substrate containing, as the conductive polymer, polythiophene and its derivative, polypyrrole and its derivative, polyaniline and its derivative, or the like. The conductive polymer may be used singly or in combination of two or more types thereof. Preferable conductive polymers are highly stable polythiophene and its derivative, and more preferable conductive polymers are poly(3,4-dialkoxyoxythiophene) and its derivative. Most preferable conductive polymers are poly(3,4-ethylenedioxythiophene) and its derivative excellent in conductivity, heat resistance and stability in the air.

When the substrate containing a conductive polymer is mounted on any other base material, the base material is not especially limited so long as it does not cause any deformation, alteration or the like in the prebaking process, developing process or the like. This base material consists of a material including, for example, a resin, a metal, or an inorganic compound. Examples of the base material include a film, a sheet or a plate containing a resin, and a foil or a plate containing a metal or an inorganic compound, and the like. In the present invention, a film is preferable. A film containing a thermoplastic resin including a polyester resin such as polyethylene terephthalate and polyethylene naphthalate, a polysulfone resin, a polyethersulfone resin, a polyetherketone resin, a cycloolefin resin, a polyimide resin, or a polycarbonate resin is preferably used.

The substrate containing the conductive polymer may contain a dopant, an enhancer and the like, for the purpose of improving the conductivity. Conventionally known dopants, including halogens such as iodine and chlorine, Lewis acids such as $BF_3$ and $PF_5$, protonic acids such as nitric acid and sulfuric acid, transition metals, alkaline metals, amino acids, nucleic acids, surfactants, dyes, chloranil, tetracyanoethylene and TCNQ, can be used as the above dopant. When polythiophene is used as the conductive polymer, polystyrene sulfonic acid is preferably used as the dopant. The dopant may be preliminarily incorporated into the substrate containing the conductive polymer or may be later incorporated into a specific portion of the substrate containing the conductive polymer, using a patterned resist film as a mask, or these methods may be used in combination. When the dopant is incorporated into a specific portion of the substrate containing the conductive polymer, the conductivity of that portion alone can be changed, thereby making it possible to fabricate functional parts such as a resistive element and a switching element in the substrate containing the conductive polymer or to provide the effect, for example, of reducing the contact resistance at an interface with an external electrode.

When the substrate having the conductive polymer contains a dopant, the content thereof is preferably in the range from 50 to 5,000 parts by mass, and more preferably from 100 to 3,000 parts by mass with respect to 100 parts by mass of the conductive polymer. When the dopant is contained in an amount within the above range, the improving effect of the conductivity can be sufficiently obtained.

The enhancer is a component which regularly aligns the conductive polymer at the time of forming the substrate containing the conductive polymer to improve conductivity, and is preferably a polar compound having a boiling point at atmospheric pressure of 100° C. or higher. Examples of the enhancer include dimethylsulfoxide (DMSO), N-methylpyrrolidone (NMP), dimethylformamide, dimethylacetamide, ethylene glycol, glycerin and sorbitol. These compounds may be used singly or in combination of two or more types thereof. When the substrate having the conductive polymer contains an enhancer, the content thereof is preferably in the range from 1% to 10%, and more preferably from 3% to 5% with respect to the substrate.

Commercially available products can be used as the substrate containing a conductive polymer. The product "CLEVIOS" (registered trademark) manufactured by H.C. Starck GmbH can be used as a composition containing polythiophene and example thereof includes "CLEVIOS P", "CLEVIOS PH", "CLEVIOS P500", "CLEVIOS P AG", "CLEVIOS P HCV", "CLEVIOS FE", and "CLEVIOS F HC".

The product "CurrentFine" (registered trademark) manufactured by Teijin DuPont Films Japan Limited can also be used. This product contains poly(3,4-ethylenedioxythiophene), and employs polystyrenesulfonic acid as a dopant. In addition, "ST series" manufactured by Achilles Corporation, wherein a polypyrrole-based conductive polymer layer is laminated, "SCS series" manufactured by Maruai, Inc., wherein a polyaniline-based conductive polymer layer is laminated, and the like, are known.

In the process of forming the substrate containing a conductive polymer, a method for forming a substrate layer containing a conductive polymer is not particularly limited. The substrate layer containing the conductive polymer can be obtained by applying a substrate containing a conductive polymer to a base material and drying the coated material or directly forming a substrate containing a conductive polymer into a film. The application method usable when the substrate containing the conductive polymer is applied to the base material is not particularly limited and includes a spin coating method, a roll coating method, a dipping method, a casting method, a spraying method, an inkjet method, a screen printing method, an applicator method, and the like. Application conditions may be selected so as to attain a desired film thickness, with consideration for the application method, solid concentration of the composition, viscosity and the like.

As other methods for forming a substrate containing a conductive polymer, it is possible to apply a substrate containing a conductive polymer to a removable base material, dry the coated material, and then use the resultant film as it is or adhere the film to the surface of another base material to form a complex. At this time, an adhesive may be used, or heating or the like can be utilized without using an adhesive. In the meantime, the substrate layer containing the conductive polymer may be formed over the entire surface of the base material, or formed in a desired portion. The thickness of the substrate layer containing the conductive polymer is preferably in the range from 0.01 to 500 μm, and more preferably from 0.03 to 10 μm since too thick a substrate layer is not economical. When the substrate containing the conductive polymer is per se used as the base material, the thickness is preferably in the range from 1 to 500 μm, and more preferably from 3 to 100 μm.

The formation of a resist film involves a process of forming a photoresist as a film on the surface of the substrate containing a conductive polymer. The application method usable when the photoresist is applied is not particularly limited and includes a spin coating method, a roll coating method, a dipping method, a casting method, a spraying method, an inkjet method, a screen printing method, an applicator method, and the like. The composition is applied at room temperature, but may be applied while heating the substrate containing the conductive polymer as needed. When the photoresist is in a solid film shape, lamination can also be conducted by a method such as pasting, thermal compression bonding and the like, not by application. The thickness of the resist film is preferably in the range from 0.5 to 10 μm, and more preferably from 1 to 5 μm.

The resist film is preferably heated by the prebaking process, and heating conditions are appropriately selected depending on the composition of the photoresist. Preferable heating temperature is in the range from 80° C. to 140° C. The atmosphere during heating is not particularly limited and is normally atmospheric air. The thickness of the resist film after the prebaking process is preferably in the range from 0.5 to 10 μm, and more preferably from 1 to 5 μm. When the film thickness is within the above range, the reduction in yield due to pinholes is suppressed so that exposure, development, removing and other treatments can be completed in a short time, and, additionally, defective development and defective removal are hard to occur.

After that, the surface of the resist film is selectively irradiated with a light via a photomask in exposing process. In the case where the photoresist is of positive type, the exposed part of the resist film becomes alkaline soluble and thus is removed in the developing process. In the case of negative type, the non-exposed part is removed. Exposure conditions in the exposing process are appropriately selected depending on the composition of the resist film (for example, type of an additive), thickness and the like. Further, radiations of normal visible light as well as charged particle beams such as ultraviolet rays, far-ultraviolet rays, X rays and electron beams can be used in this exposure.

Subsequently, a soluble part of the resist film is removed by means of a developing solution in the developing process to expose the surface of the substrate layer containing the conductive polymer. The resist film remaining after development may be utilized as a mask in the next process or as a material constituting a device such as an insulating part. The developing solution of the present invention is employed in the above developing process.

A developing solution which has hitherto been commonly used for a resist film containing a naphthoquinone diazide-novolac type photoresist preferred as a positive type resist is an aqueous alkaline solution. Organic alkalis and inorganic alkalis are indicated as alkalis used in the preparation of this aqueous alkaline solution. Organic alkalis such as a tetraalkylammonium hydroxide including tetramethylammonium hydroxide (TMAH) are frequently used for manufacturing electric and electronic components such as a semiconductor, a liquid crystal panel, and a printed wiring board. On the other hand, it is known that, when a metal such as copper and chromium is etched using a patterned resist film portion as a mask, sodium hydroxide or a buffer solution containing sodium hydroxide and an inorganic alkali such as sodium carbonate may be used, in some cases, for the purpose of preventing the corrosion of the metal.

The present inventors found that resist patterns ranging from fine patterns to wide patterns can freely be obtained by forming a resist film on a substrate containing a conductive polymer and, after exposure, developing the resist film by means of a developing solution containing an alkaline agent and preferably a predetermined concentration of an acid and/or a salt thereof, and that the developing solution causes less damages, for example, including the increase in surface resistance of the substrate containing the conductive polymer, which is brought into contact therewith, and the reduction in adhesiveness, and then completed the present invention.

The developing solution of the present invention is an alkaline developing solution containing an acid as a protective agent for the substrate containing the conductive polymer.

The addition of a protective agent to the developing solution can suppress an increase in surface resistance of the substrate containing the conductive polymer when brought into contact with the developing solution. Examples of the protective agent include a surfactant, an inorganic salt, a carboxylic acid salt, an amino acid, and the like. One or more of these materials can be used in combination, however, an acid or a salt thereof is an essential ingredient in the present invention since the effect of suppressing the increase in surface resistance is great especially when such an acid or a salt thereof is incorporated into the developing solution.

The developing solution is alkaline so as to possess the developability, and thus must indispensably have a pH of higher than 7. The pH of the developing solution is preferably 11 or higher, more preferably 12 or higher, and further preferably 12.5 or higher. When the upper limit on the pH exceeds 13.5, the surface resistance is remarkably increased. Further, when the upper limit on the pH exceeds 14, the surface resistance is further extremely increased. Therefore, the upper limit on the pH is preferably 14 or lower, and more preferably 13.5 or lower.

The main ingredients of the developing solution of the present invention are an inorganic alkaline agent and a solvent, and may contain an acid and/or a salt thereof as essential ingredients and various other additives.

The alkaline agent that is one of the main ingredients of the developing solution is not particularly limited so long as it is an inorganic substance showing basicity when dissolved in a solvent. The alkaline agent is an inorganic alkaline agent such as $KOH$, $NaOH$, $K_2CO_3$, $KHCO_3$, $Na_2CO_3$ and $NaHCO_3$, and is preferably an inorganic alkaline agent which significantly exhibits effects of a protective agent. More preferable alkaline agent is a potassium salt such as $KOH$, $K_2CO_3$ and $KHCO_3$, and $KOH$ is further preferable. An organic alkaline agent, typified by tetraalkylammonium hydroxide, may be incorporated if the amount thereof to be incorporated is a small amount. Specifically, an organic alkaline agent may be incorporated, if the amount thereof to be incorporated is less than 50% by mass of the alkaline agent.

One or more of these alkaline agents may be used in combination. Especially, the use of alkaline hydroxide and a carbonate in combination is preferred as providing the effect of preventing the increase in surface resistance value of a substrate containing a conductive polymer. The amount of the carbonate to be used in combination with the alkaline hydroxide is preferably in the range from 0.1 to 2.0 mol, and more preferably from 0.5 to 1.5 mol with respect to 1 mol of the alkaline agent. The carbonate is preferably potassium carbonate and sodium carbonate. Potassium carbonate is preferred as the carbonate.

In the case where the conductive polymer layer and the resist film are in direct contact with each other, the concentration of alkaline metals contained in the developing solution is preferably in the range from 0.08 to 0.20 mol/l, more preferably from 0.09 to 0.18 mol/l, and further preferably from 0.09 to 0.15 mol/l for high-resolution development. Preferable alkaline metal is potassium.

When ion of an alkaline metal other than potassium and sodium is contained in the alkaline agent, the usable metal ion includes a lithium ion, a rubidium ion and a cesium ion. When a potassium ion and a sodium ion are co-existing, the exposed part in the resist film after the exposing process can efficiently remove, thereby making it possible to carry out the present invention. However, in the case where the resist pattern is in direct contact with the conductive polymer layer, when the concentration of the sodium ion is too high, the resist pattern is easily peeled and fallen off from the substrate layer containing the conductive polymer, thereby making it difficult to form a desired resist pattern. Accordingly, the upper limit on the concentration of the sodium ion in the developing solution of the present invention is preferably less than 0.1 mol/l.

The solvent that is one of the main ingredients of the developing solution of the present invention is not particularly limited so long as an inorganic alkaline agent and a protective agent can be dissolved therein. The solvent is preferably a polar solvent, and more preferably water. A material obtained by mixing a polar solvent with water can similarly preferably be used. It is not preferable to incorporate a basic amine, ammonia and piperadine, among polar solvents, in large amounts because they adversely affect the conductive polymer.

One or more acids and/or salts thereof selected from the group consisting of an inorganic acid, amino acid having an isoelectric point of smaller than 7 and a carboxylic acid having two or more carboxyl groups can be used as the acid and/or salt thereof which is an essential ingredient for the developing solution of the present invention. Examples of the inorganic acid include hydrochloric acid, nitric acid, sulfuric acid, phosphoric acid, perchloric acid, chloric acid, chlorous acid, boric acid, hydrofluoric acid, and the like. Of these, hydrochloric acid, nitric acid, sulfuric acid and phosphoric acid are preferable. More preferable are hydrochloric acid and phosphoric acid.

Preferable amino acid having an isoelectric point of smaller than 7 is an α-amino acid and example thereof includes an acidic amino acid such as aspartic acid and glutamic acid; a neutral amino acid such as glycine, alanine, valine, leucine, isoleucine, serine, threonine, cysteine, methionine, asparagine, glutamine, proline, phenylalanine, tyrosine and tryptophan. These α-amino acids except glycine are optically active, D-type and L-type can similarly be used. More preferable are glycine, glutamic acid and aspartic acid. Glycine and aspartic acid are particularly preferred. When the solvent is water, those having not more than 6 carbon atoms are preferred as having a tendency to exhibit high solubility in water.

Examples of the carboxylic acid having two or more carboxyl groups include aliphatic and aromatic dicarboxylic acids such as oxalic acid, malonic acid, succinic acid, glutaric acid, adipic acid, pimelic acid, suberic acid, azelaic acid, sebacic acid, phthalic acid, isophthalic acid and terephthalic acid, a tricarboxylic acid such as citric acid, and the like. The carboxylic acid having two or more carboxyl groups has a plurality of pKa values corresponding to the number of carboxylic acids, and preferably has the smallest pKa value of 3 or less. When the solvent is water, those having not more than 6 carbon atoms are preferred as having a tendency to exhibit high solubility in water.

These acids may be salts, and the base in the alkaline agent is preferred as a counterion of these acids when the acids are salts. Two or more of the above acids and/or salts thereof may be used in combination, and, among others, a combination of an amino acid and an inorganic acid is preferred. The concentration of the acid and/or salt thereof used in the present invention is preferably in the range from 0.01% to 10% and more preferably from 0.1% to 1% in mass concentration with respect to the entire developing solution. Within this range, the concentration more preferably falls within the range of from 0.01 to 0.5 mol with respect to 1 mol of the alkaline agent contained in the developing solution.

In the developing solution and pattern forming method of the present invention, a surfactant and an inorganic salt are exemplified as a protective agent usable in addition to the acid and/or salt thereof. A nonionic surfactant is preferable as the surfactant, and a neutral calcium salt is preferable as the inorganic salt. Specifically, a polyoxyethylene alkyl ether is preferable as the surfactant and polyoxyethylene tridecyl ether is more preferable. As the inorganic salt, a halide of an alkali earth metal such as calcium chloride is especially preferred. The total content of the ingredients used in combination as the protective agent is preferably less than 50% and more preferably less than 30% based on the entire protective agent containing an acid and/or a salt thereof as an essential ingredient.

After partial removal of the exposed part or non-exposed part in the resist film by the developing process employing the developing solution of the present invention, the exposed surface of the substrate containing the conductive polymer and the developing solution would be in contact with each other. Conventional developing solutions cause damages to the surface of the substrate containing the conductive polymer upon this contact, whereas such damages are suppressed by the developing solution of the present invention.

The period of time for development employing the developing solution of the present invention is preferably not less than 1 second and not more than 30 minutes, and more preferably not less than 10 seconds and not more than 200 seconds. Too long a development period of time may cause corrosion of a part of the surface of the substrate containing the conductive polymer in some cases. On the other hand, too short a development period of time may cause an undeveloped part. The substrate containing the conductive polymer, which is exposed by the developing process, may then be partially altered using the patterned resist film portion as a mask by a method such as doping, or may be removed using the resist film portion as a mask by a method such as etching.

The temperature of the developing solution in the developing process is not particularly limited. The developing speed is higher as the developing solution temperature becomes higher in the developing process, whereas a low temperature slows the developing speed and thus requires time, but the reduction in film and the falling-off of the resist pattern are hard to occur. Therefore, a preferable temperature of the developing solution is not less than 15° C. and not more than 35° C. The immersion method, spraying method or the like can be employed as the developing method.

When the exposed substrate layer part containing the conductive polymer is removed, known etching solutions and etching methods can be used in accordance with the properties of the conductive polymer. A specific example of the etching solution is an etching solution, as disclosed in WO 2008/041461, containing more than 0.5% and 70% or less of $(NH_4)_2Ce(NO_3)_6$ or not less than 0.5% and not more than 30% of $Ce(SO_4)_2$, and the method disclosed therein can also be employed as a specific etching method.

In the present invention, when an etching solution containing $(NH_4)_2Ce(NO_3)_6$ in an amount of preferably 1% to 30%, and more preferably from 3% to 20% is used, the exposed substrate containing the conductive polymer can be efficiently removed without impairing the substrate layer containing the conductive polymer, which is in contact with the lower side of the patterned resist film portion 131.

A removing agent can be used to remove the patterned resist film portion. Examples of the removing agent less adversely affecting the substrate containing the conductive polymer include (a) a non-protonic organic solvent containing an oxygen atom or a sulfur atom or both thereof in its chemical structure, and (b) an organic solvent having a nitrogen atom in its chemical structure, other than a primary amine compound, a secondary amine compound and an organic quaternary ammonium salt. The non-protonic organic solvent (a) and organic solvent (b) may be used in combination.

Preferable removing agents are as follows. Specifically, the non-protonic organic solvent (a) is preferably at least one compound of dimethylsulfoxide, ethylene carbonate and γ-butyrolactone, and the organic solvent (b) is preferably at least one compound of N-methylpyrrolidone, dimethylformamide and dimethylacetamide. Further, those containing a combination of these (a) and (b) are also preferable.

The treatment temperature employing the removing agent is not particularly limited. A high treatment temperature causes a tendency that the viscosity of the removing agent becomes low, so that the removal of the resist film part is completed in a short time. However, too high a treatment temperature may increase the surface resistance of the patterned substrate portion 121 containing the conductive polymer after removing and reduce the conductivity in some cases. Therefore, the treatment temperature is preferably in the range from 5° C. to 60° C., more preferably from 5° C. to 50° C., and further preferably from 10° C. to 40° C.

According to the present invention, finely patterned conductive pattern and resist pattern can be formed, and the surface resistance of the substrate containing the conductive polymer keeps a good value.

Example

Hereinafter, the present invention is specifically described using Examples. The present invention is not limited to these Examples.

<Preparation of Developing Solution>

As regards developing solutions listed in Tables 1, 2 and 4, an acid as indicated in a column of "Acid" in the tables was firstly weighed into a glass beaker to attain a weight as indicated in a column of "Added Amount of Acid (unit: gram)", and dissolved in 90 g of deionized water, and then an alkaline agent and deionized water were appropriately added thereto until the pH value arrived at a value as indicated in a column of "pH" in the tables, while the pH of the solution was measured with a glass electrode "9621C" (type name) manufactured by Horiba Ltd. and a pH meter "D-12" (type name) manufactured by Horiba Ltd. The total solution weight after preparation was measured and filled in the tables. The indication for Example 11 in Table 1 that the acid is "Hydrochloric acid+glycine" and that the amount thereof added is "0.044+0.075" means the addition of hydrochloric acid as HCl in an amount of 0.044 g and glycine in an amount of 0.075 g. In the meantime, the pH meter was calibrated with three kinds of standard solutions having a pH of 4, 7 and 9, respectively, before use.

When an alkaline agent 2 was used together with an alkaline agent 1, as shown for Examples 18 to 25 in Table 3, an acid as indicated in a column of "Acid" in the tables was firstly weighed into a glass beaker to attain a weight as indicated in a column of "Added Amount of Acid (unit: gram)" in the tables, and dissolved in 90 g of deionized water. Next, the alkaline agent 2 which is an alkaline carbonate salt was added to the solution in an amount as indicated in a column of "Added Amount of Alkaline Agent 2 (unit: gram)" in the tables, and dissolved therein, and the alkaline agent 1 and deionized water were appropriately added thereto until the pH value arrived at a value as indicated in a column of "pH" in the tables, while the pH of the solution was measured with a glass electrode-equipped pH meter. The total solution weight after preparation was measured and filled in the tables.

In the case where the acid was solid at normal temperature, it was weighed and collected in the state where it remained solid. For an acid normally used as a solution, such as hydrochloric acid, the dilution concentration was calculated so that the pure weight of the acids was the "Added Amount of Acid" to use the aqueous acid solution. Namely, when the "Added Amount of Acid" indicated in the tables is 1 g and an acid was a 50% aqueous acid solution, this indication means that 2 g of the aqueous acid solution was used for addition.

Used were a 35% concentration product "White Chloride" (product name) manufactured by TOAGOSEI Co., LTD. as hydrochloric acid, a highest-quality reagent of 60% nitric acid manufactured by Wako Pure Chemical Industries as nitric acid, a highest-quality reagent of sulfuric acid (purity: 95.0% or more) manufactured by Wako Pure Chemical Industries as sulfuric acid, a highest-quality reagent of phosphoric acid (purity: 85.0% or more) manufactured by Wako Pure Chemical Industries as phosphoric acid, a Wako highest-quality product of oxalic acid (anhydrous) manufactured by Wako Pure Chemical Industries as oxalic acid, a highest-quality reagent of glycine manufactured by Kishida Chemical Co., Ltd. as glycine, a highest-quality reagent of L-glutamic acid manufactured by Wako Pure Chemical Industries as glutamic acid, a highest-quality reagent of citric acid (monohydrate) manufactured by Kishida Chemical Co., Ltd. as citric acid, a Wako highest-quality product of phthalic acid manufactured by Wako Pure Chemical Industries as phthalic acid, a Wako highest-quality product of DL-aspartic acid manufactured by Wako Pure Chemical Industries as aspartic acid, a Wako standard product of DL-arginine manufactured by Wako Pure Chemical Industries as arginine, a highest-quality reagent of benzoic acid manufactured by Wako Pure Chemical Industries as benzoic acid, and a highest-quality reagent of acetic acid (purity: 99.7% or more) manufactured by Wako Pure Chemical Industries as acetic acid.

As the alkaline agents, used were a product "Super Kali R" (product name) manufactured by TOAGOSEI Co., LTD. as KOH, a 25% tetramethylammonium hydroxide solution (for precision analysis) manufactured by Wako Pure Chemical Industries as TMAH, 48% sodium hydroxide manufactured by TOAGOSEI Co., LTD. as NaOH, a highest-quality reagent of potassium carbonate (anhydrous) manufactured by Wako Pure Chemical Industries as $K_2CO_3$ and a highest-quality reagent of sodium carbonate (anhydrous) manufactured by Kishida Chemical Co., Ltd. as $Na_2CO_3$.

<Formation of Substrate Layer Containing Conductive Polymer>

A polyethylene terephthalate (PET) sheet having a corona-treated surface was selected as a base material containing no conductive polymer, and about 100 nm thickness thin film containing a conductive polymer, having a thickness of, was formed on the surface of the sheet by using a product "CLEVIOS FE" (trade name) manufactured by H.C. Starck GmbH and containing poly(3,4-ethylenedioxythiophene) as the conductive polymer. The obtained product was used as a base substrate A wherein the substrate layer containing the conductive polymer was laminated. In Examples 26 and 27 and Comparative Examples 12 to 15 in Table 4, a film base substrate of "ST"-Poly manufactured by Achilles Corporation wherein a polypyrrole-based conductive polymer layer was laminated on a PET film as a base material was used, in place of the "CLEVIOS FE/PET film".

In Examples 28 and 29 and Comparative Examples 16 to 19, "SCS A-PET" (trade name) manufactured by Maruai, Inc. was used as the film base substrate wherein a polyaniline-based conductive polymer layer was laminated on an A-PET film base material.

<Formation of Resist Pattern>

A product "TRP-43" (trade name) manufactured by TOAGOSEI Co., LTD. which is a positive type photoresist containing a naphthoquinone diazide compound and a novolac resin, was coated on the surface of the base substrate A with a spin coater, and subjected to prebaking at a temperature of 90° C. for 15 minutes to form a photoresist having a resist layer with a film thickness of 1.2 μm. This resist layer was exposed with light in an amount of 100 mJ/cm$^2$ via a mask pattern by means of an exposure device manufactured by Hitec Ltd., developed at 25° C. by various developing solutions as shown in Table 1, washed with water and then dried to form a base substrate B having a resist pattern on the substrate layer containing the conductive polymer of the base substrate A.

<Formation of Conductive Pattern>

A conductive pattern was formed by immersing the base substrate B in an etching solution as a mixture of 10% by mass of cerium ammonium nitrate and 10% by mass of nitric acid, using the resist pattern of the base substrate B as a mask at a temperature of 30° C. for 1 minute to etch the substrate containing the conductive polymer, and washing the base substrate with water.

Finally, the resist layer on the conductive polymer was removed by immersing the base substrate in γ-butyrolactone as a removing solution at 10° C. for 1 minute while stirring with a stirring blade at a rotation rate of 400 per minute. Thereafter, the base substrate was immersed in ion exchange water as a washing solution at 10° C. for 1 minute while stirring with a stirring blade at a rotation rate of 400 per minute to rinse the base substrate. In this way, a base substrate C having the conductive pattern was obtained.

<Evaluation of Surface Resistance of Substrate Containing Conductive Polymer>

With respect to the base substrate A wherein the substrate containing the conductive polymer was exposed to its surface, an ES type 4-point probe "MCP-TP08" (trade name) manufactured by DIA INSTRUMENTS CO., LTD. having a distance between pins of 5 mm was brought into contact with the surface of the substrate to measure the surface resistance value based on the 4-probe method according to JIS K7194 by means of a surface resistance meter "Loresta GP" (trade name) manufactured by DIA INSTRUMENTS CO., LTD. The surface resistance value was measured at 6 points near the center of the base substrate, and the average value thereof was defined as "surface resistance 1". Then, the base substrate A which had been measured for surface resistance was immersed in various developing solutions as shown in Tables 1 to 4 at 25° C. for 1 minute, taken out, and sufficiently washed with running deionized water. The deionized water was allowed to be absorbed onto a clean paper "Kimwipe" (product name), and the base substrate was naturally dried for 30 minutes. The surface resistance was measured again and it was defined as "surface resistance 2". The calculated value (surface resistance 2−surface resistance 1)/surface resistance 1×100 is indicated as an increase rate (unit: %) in Tables 1 to 4. It is shown that as the increase rate value was greater, the increase in surface resistance due to the developing solution was great, and thus that a developing solution having a smaller increase rate value is more excellent. In Examples 28 and 29 and Comparative Examples 16 to 19 employing polyaniline in Table 4, the surface resistance was increased to such a level as to be beyond the measurement range of the surface resistance meter, when the base substrate was immersed in the developing solution for 1 minute. Therefore, the immersion period of time was shortened to less than 1 minute for the measurement.

TABLE 1

| | Acid | Added Amount of Acid (g) | Solution Weight (g) | pH | Increase Rate (%) |
|---|---|---|---|---|---|
| Example 1 | Hydrochloric acid | 0.088 | 100.2 | 13.43 | 52 |
| Example 2 | Nitric acid | 0.280 | 100.2 | 13.41 | 69 |
| Example 3 | Sulfuric acid | 0.196 | 100.8 | 13.35 | 68 |
| Example 4 | Phosphoric acid | 0.092 | 100.6 | 13.39 | 53 |
| Example 5 | Oxalic acid | 0.104 | 99.5 | 13.42 | 65 |
| Example 6 | Glycine | 0.154 | 99.6 | 13.42 | 59 |
| Example 7 | Glutamic acid | 0.151 | 99.5 | 13.43 | 62 |
| Example 8 | Citric acid | 0.150 | 99.7 | 13.44 | 65 |
| Example 9 | Phthalic acid | 0.208 | 100.9 | 13.41 | 61 |
| Example 10 | Aspartic acid | 0.303 | 99.6 | 13.40 | 59 |
| Example 11 | Hydrochloric acid + Glycine | 0.044 + 0.075 | 100.1 | 13.42 | 56 |
| Comparative Example 1 | None | — | 95.0 | 13.42 | 71 |
| Comparative Example 2 | Arginine | 0.402 | 99.7 | 13.42 | 84 |
| Comparative Example 3 | Benzoic acid | 0.307 | 99.7 | 13.43 | 78 |
| Comparative Example 4 | Acetic acid | 0.150 | 99.9 | 13.40 | 82 |

The symbol "—" means the addition of no acid.

The result shown in Table 1 shows that, also in the case where the same KOH is used as the alkaline agent, the increase rate of the surface resistance of the substrate containing the conductive polymer is significantly increased to 70% or more, when the substrate is brought into contact with the developing solution to which the acid according to the present invention is not added or to which an acid different from the acid according to the present invention is added. On the other hand, from the fact that the increase rate of the surface resistance of the substrate containing the conductive polymer was below 70% when the substrate was brought into contact with the developing solution of the present invention, the developing solution of the present invention can be said to be hard to adversely affect the surface resistance of the substrate containing the conductive polymer.

For the developability of the developing solution, the following test was conducted.

(Developability)

The base substrate B on which a resist pattern with lines having a width of 100 μm & spaces was produced was observed, after drying, using a 300-power light microscope to check the presence or absence of a resist residue in a part from which the resist was to be removed by development. In Examples 1 to 11 and Comparative Examples 1 to 4 shown in Table 1, no improper resist residue was present and a clear resist pattern was obtained in all the examples. Therefore, the evaluation result of the developability was not indicated in Table 1. Clearly from results in Table 2, Comparative Examples 8 and 9 do not show good developability, wherein resist residues were observed in 5 or more space portions in a part checked along the line within the line length range of 10 mm in total. Thus, the examples are indicated with the hollow triangular mark (Δ). On the other hand, example excellent in both developability and adhesiveness is indicated with the circular symbol (○) in a column of "Developability" in Table 2.

(Adhesiveness)

The base substrate C was obtained by forming a resist pattern having lines with a line width of 100 μm & spaces in the resist layer, etching the substrate containing the conductive polymer, and then removing the resist layer with a removing solution. The base substrate C was observed using a 300-power light microscope to check the abnormality of the lines. If removal occurs between the resist pattern and the substrate containing the conductive polymer, the etching solution would enter the gap so that the conductive pattern to be left would be etched and discontinued. In Examples 1 to 11 and Comparative Examples 1 to 4 in Table 1, no improper conductive pattern was observed and a clear conductive pattern was obtained in all the examples. Therefore, the evaluation results of the developability and adhesiveness are not indicated in Table 1. In Table 2, Comparative Examples 10 and 11 show good developability but do not show good adhesiveness. When the resist was removed after etching, the conductive pattern was discontinued in 5 or more places in a part checked along the line within the line length range of 10 mm in total. Thus, the Comparative Examples were judged to be defective in adhesiveness, and are indicated with the solid triangular symbol (▲) in a column of "Developability" in Table 2. Example showing both good developability and good adhesiveness is indicated with the circular symbol (○).

TABLE 2

|  | Acid | Added Amount of Acid (g) | Alkaline Agent | Solution Weight (g) | pH | Increase Rate (%) | Developability |
|---|---|---|---|---|---|---|---|
| Example 12 | Hydrochloric acid | 0.172 | KOH | 100.2 | 13.26 | 43 | ○ |
| Example 13 | Glycine | 0.299 | KOH | 100.8 | 13.25 | 41 | ○ |
| Example 14 | Hydrochloric acid | 0.192 | KOH | 99.9 | 12.84 | 40 | ○ |
| Example 15 | Glycine | 0.299 | KOH | 100.2 | 12.83 | 38 | ○ |
| Example 16 | Hydrochloric acid | 0.175 | NaOH | 100.4 | 13.21 | 46 | ○ |
| Example 17 | Glycine | 0.300 | NaOH | 100.5 | 13.19 | 45 | ○ |
| Comparative Example 5 | None | — | TMAH | 100.9 | 13.25 | 81 | ○ |
| Comparative Example 6 | Hydrochloric acid | 0.175 | TMAH | 99.7 | 13.23 | 81 | ○ |
| Comparative Example 7 | Glycine | 0.299 | TMAH | 99.9 | 13.25 | 84 | ○ |
| Comparative Example 8 | None | — | KOH | 100.7 | 12.82 | 46 | Δ |
| Comparative Example 9 | None | — | TMAH | 99.7 | 12.81 | 69 | Δ |
| Comparative Example 10 | Hydrochloric acid | 0.174 | TMAH | 99.7 | 12.82 | 116 | ▲ |
| Comparative Example 11 | Glycine | 0.298 | TMAH | 99.6 | 12.81 | 106 | ▲ |

The symbol "—" means the addition of no acid.

The result shown in Table 2 indicates that, when the substrate is brought into contact with the developing solution containing, as the alkaline agent, TMAH different from that of the present invention, no effect is obtained even though the same acid as that of the present invention is added, or, conversely, the increase rate of the surface resistance of the substrate containing the conductive polymer is increased or the developability is deteriorated as compared with the case where no acid is added, and thus that no good results can be obtained. Namely, the result shows that the advantageous effects of the present invention are obtained only by using a special combination of the ingredients.

When focusing on the developability for Examples 14 and 15 and Comparative Example 8, the developing solution of the present invention has good developability even at a pH value such that the developability would be deteriorated when an alkaline agent alone is used.

TABLE 3

| | Acid | Added Amount of Acid (g) | Alkaline Agent 1 | Alkaline Agent 2 | Added Amount of Alkaline Agent 2 (g) | Solution Weight (g) | pH | Increase Rate (%) |
|---|---|---|---|---|---|---|---|---|
| Example 18 | Glycine | 0.350 | KOH | $K_2CO_3$ | 1.10 | 200.1 | 13.18 | 44 |
| Example 19 | Hydrochloric acid | 0.600 | KOH | $Na_2CO_3$ | 1.05 | 200.3 | 13.19 | 42 |
| Example 20 | Glycine | 0.350 | KOH | $K_2CO_3$ | 2.10 | 200.4 | 13.20 | 42 |
| Example 21 | Hydrochloric acid | 0.600 | KOH | $Na_2CO_3$ | 2.00 | 200.5 | 13.21 | 40 |
| Example 22 | Glycine | 0.350 | NaOH | $K_2CO_3$ | 1.10 | 199.6 | 13.21 | 43 |
| Example 23 | Hydrochloric acid | 0.600 | NaOH | $Na_2CO_3$ | 1.00 | 200.2 | 13.17 | 41 |
| Example 24 | Glycine | 0.350 | NaOH | $K_2CO_3$ | 2.10 | 200.1 | 13.18 | 45 |
| Example 25 | Hydrochloric acid | 0.600 | NaOH | $Na_2CO_3$ | 2.00 | 200.5 | 13.19 | 43 |

TABLE 4

| | Conductive polymer | Acid | Added Amount of Acid (g) | Alkaline Agent | Solution Weight (g) | pH |
|---|---|---|---|---|---|---|
| Example 26 | Polypyrrole | Hydrochloric acid | 0.171 | KOH | 100.9 | 13.19 |
| Example 27 | Polypyrrole | Glycine | 0.301 | KOH | 99.3 | 13.19 |
| Comparative Example 12 | Polypyrrole | None | — | KOH | 103.1 | 13.18 |
| Comparative Example 13 | Polypyrrole | None | — | TMAH | 100.6 | 13.18 |
| Comparative Example 14 | Polypyrrole | Hydrochloric acid | 0.175 | TMAH | 100.7 | 13.18 |
| Comparative Example 15 | Polypyrrole | Glycine | 0.299 | TMAH | 99.9 | 13.19 |
| Example 28 | Polyaniline | Hydrochloric acid | 0.17 | KOH | 100.9 | 13.19 |
| Example 29 | Polyaniline | Glycine | 0.301 | KOH | 99.3 | 13.19 |
| Comparative Example 16 | Polyaniline | None | — | KOH | 103.1 | 13.18 |
| Comparative Example 14 | Polyaniline | None | — | TMAH | 100.6 | 13.18 |
| Comparative Example 18 | Polyaniline | Hydrochloric acid | 0.175 | TMAH | 100.7 | 13.18 |
| Comparative Example 19 | Polyaniline | Glycine | 0.299 | TMAH | 99.9 | 13.19 |

The symbol "—" means the addition of no acid.

Examples 18 to 29 and Comparative Examples 12 to 19 in Tables 3 and 4 had no problem with resist developability and adhesiveness, and clear resist pattern and conductive pattern were obtained in all the examples. The result shown in Table 3 indicates that, when the alkaline agent is a mixture of alkaline hydroxide and an alkaline carbonate salt, the developing solution is a good developing solution providing a low increase rate of surface resistance.

The result shown in Table 4 indicates that the developing solution of the present invention provides similar effects to those obtained when the developing solution is brought into contact with a substrate containing a polythiophene-based conductive polymer, also as a developing solution which is to be brought into contact with a substrate containing a polypyrrole-based or polyaniline-based conductive polymer, in addition to the polythiophene-based conductive polymer.

INDUSTRIAL APPLICABILITY

The developing solution of the present invention provides a conductive polymer pattern having high conductivity and a fine pattern, and can be used, as an alternative to ITO containing a rare element, in the production of transparent conductive films of various electronic display elements, optical elements of solar batteries, circuits and the like.

EXPLANATION OF THE REFERENCE NUMBERS

11. Base material containing no conductive polymer
12. Substrate or substrate layer containing conductive polymer
121. Patterned substrate portion containing conductive polymer
122. Substrate portion containing altered conductive polymer
13. Resist film
131. Patterned resist film portion

What is claimed is:
1. A method for forming a resist pattern on a substrate comprising a conductive polymer, the method sequentially comprising:

forming a photoresist film on said substrate;
prebaking, by heating, said photoresist film;
exposing a resist film from said prebaking to leave at least a portion of a surface of said resist film arranged on the surface of a conductive layer in the surface of said resist film unexposed; and
removing the exposed part through said exposing with a developing solution, to expose at least a portion of said substrate comprising said conductive polymer,
wherein:
said conductive polymer is a polythiophen or a polypyrrole;
a positive type photoresist is developed with said developing solution, which comprises: i) a component comprising at least one selected from the group consisting of phosphoric acid, glycine, and aspartic acid, ii) an alkaline agent comprising KOH and $K_2CO_3$, and iii) water; and
said developing solution is an alkaline solution.

2. The method of claim 1, wherein the conductive polymer is a polythiophen.

3. The method of claim 1, wherein the conductive polymer is a polypyrrole.

4. The method of claim 1, wherein the developing solution comprises i) a component comprising phosphoric acid.

5. The method of claim 1, wherein the developing solution comprises i) a component comprising glycine.

6. The method of claim 1, wherein the developing solution comprises i) a component comprising aspartic acid.

7. A method for forming a resist pattern on a substrate comprising a conductive polymer, the method comprising:
exposing a surface of a photoresist arranged on said substrate and leaving at least a part of the surface of the photoresist unexposed; and
contacting said substrate with a developing solution, to develop said photoresist,
wherein:
said conductive polymer is a polythiophen or a polypyrrole;
a positive type photoresist is developed with said developing solution, which comprises i) a component comprising at least one selected from the group consisting of phosphoric acid, glycine, and aspartic acid, ii) an alkaline agent comprising KOH and $K_2CO_3$, and iii) water; and
said developing solution is an alkaline solution.

8. The method of claim 7, wherein the conductive polymer is a polythiophen.

9. The method of claim 7, wherein the conductive polymer is a polypyrrole.

10. The method of claim 7, wherein the developing solution comprises i) a component comprising phosphoric acid.

11. The method of claim 7, wherein the developing solution comprises i) a component comprising glycine.

12. The method of claim 7, wherein the developing solution comprises i) a component comprising aspartic acid.

* * * * *